United States Patent [19]
Goto

[11] Patent Number: 5,614,432
[45] Date of Patent: Mar. 25, 1997

US005614432A

[54] METHOD FOR MANUFACTURING LDD TYPE MIS DEVICE

[75] Inventor: Yoshiro Goto, Tokyo, Japan

[73] Assignee: NEC Corporation, Tokyo, Japan

[21] Appl. No.: 426,650

[22] Filed: Apr. 21, 1995

[30] Foreign Application Priority Data

Apr. 23, 1994 [JP] Japan .................................. 6-107617
Apr. 23, 1994 [JP] Japan .................................. 6-107618

[51] Int. Cl.$^6$ ................................................ H01L 21/70
[52] U.S. Cl. ................................ 437/56; 437/57; 437/58; 437/35; 437/41
[58] Field of Search ..................... 437/41 SW, 41 RLD, 437/35, 56, 57, 58

[56] References Cited

U.S. PATENT DOCUMENTS

| | | | |
|---|---|---|---|
| 5,015,595 | 5/1991 | Wollesen | 437/41 RLD |
| 5,024,960 | 6/1991 | Haken | 437/41 RLD |
| 5,170,232 | 12/1992 | Narita | 437/41 RLD |
| 5,270,226 | 12/1993 | Hori et al. | 437/41 SW |
| 5,292,674 | 3/1994 | Okabe et al. | 437/44 |

FOREIGN PATENT DOCUMENTS

| | | |
|---|---|---|
| 63-215075 | 9/1988 | Japan . |
| 222862 | 1/1990 | Japan . |
| 2310931 | 12/1990 | Japan . |

*Primary Examiner*—Trung Dang
*Attorney, Agent, or Firm*—Sughrue, Mion, Zinn, Macpeak & Seas

[57] ABSTRACT

In a method for manufacturing a CMIS transistor, after gate electrodes are formed, deep P type impurity regions and shallow N type impurity regions are formed within both of a PMOS area and an NMOS area. Then, after sidewall insulating layers are formed on sidewalls of the gate electrodes, P type impurity ions are introduced into the PMOS area and N type impurity ions are introduced into the NMOS area.

9 Claims, 21 Drawing Sheets

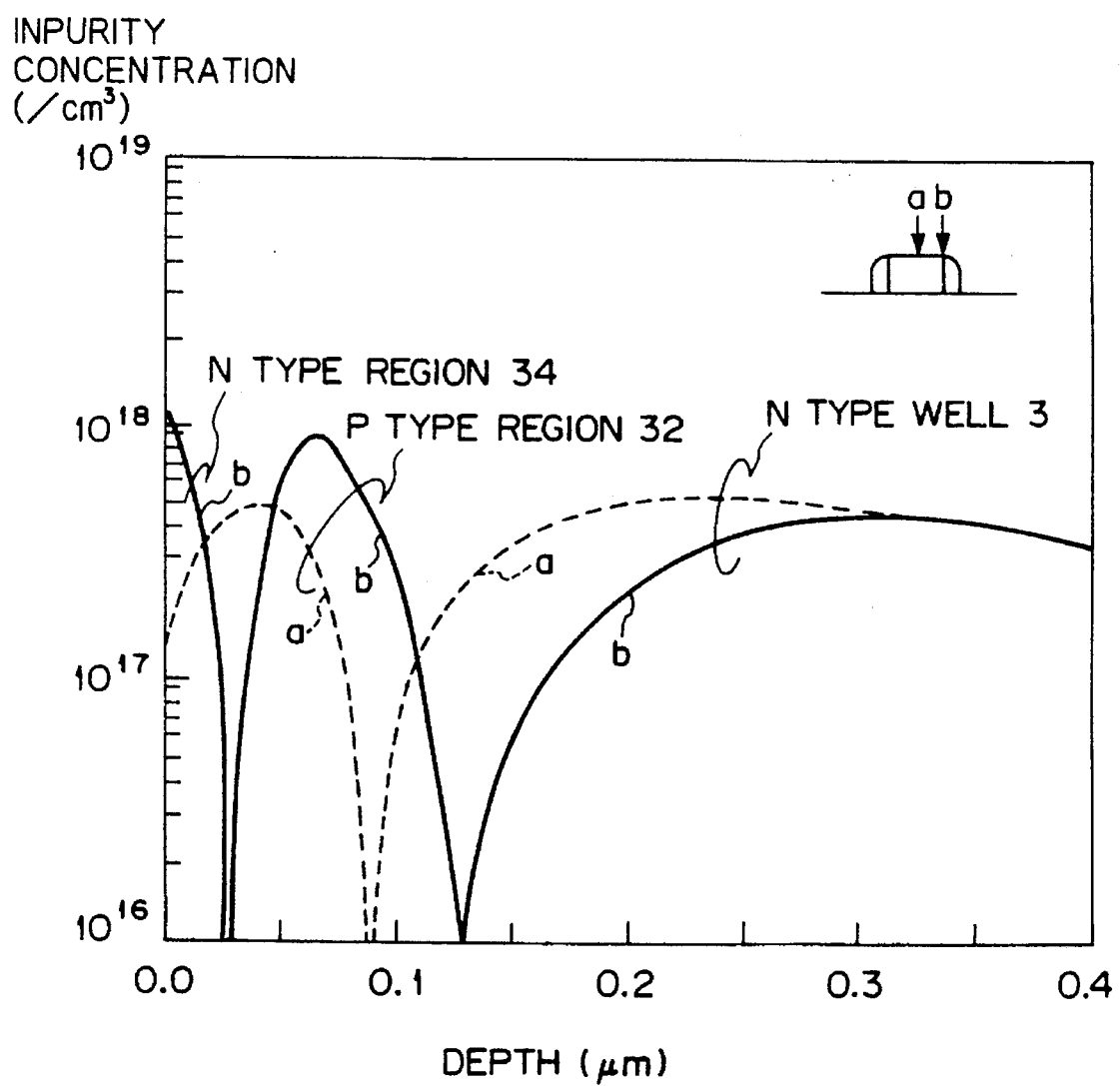

METHOD FOR MANUFACTURING LDD TYPE MIS DEVICE

BACKGROUND OF THE INVENTION

1. Field of the Invention

The present invention relates to a method for manufacturing a lightly-doped drain (LDD) type MOS (broadly, MIS) device and more particularly, to a method for manufacturing an LDD type CMOS device.

2. Description of the Related Art

In a fine-structured MOS device, in order to avoid deterioration of characteristics due to hot carriers, an LDD structure has been broadly used.

In a prior art method for manufacturing an LDD type CMOS device, after gate electrodes are formed on a PMOS area and an NMOS area of a semiconductor substrate, a shallow P type region is formed in the PMOS area by using a photoresist mask covering the NMOS area, and a shallow N type region is formed in the NMOS area using a photoresist mask covering the PMOS area. Also, after sidewall insulating layers are formed on sidewalls of the gate electrodes, a deep P type region is formed in the PMOS area by using a photoresist mask covering the NMOS area, and a deep N type region is formed in the NMOS area using a photoresist mask covering the PMOS area. This will be explained later in detail.

In the above-described prior art manufacturing method, however, four photolithography processes are required for an LDD structure, which increases the manufacturing cost.

SUMMARY OF THE INVENTION

It is an object of the present invention to reduce the manufacturing cost of an LDD type CMOS device.

Also, an object of the present invention is to suppress a punch through phenomenon in both PMOS and NMOS transistors.

According to the present invention, in a method for manufacturing a CMOS transistor, after gate electrodes are formed, deep P-type impurity regions and shallow N-type impurity regions are formed within both of a PMOS area and an NMOS area. Then, after sidewall insulating layers are formed on sidewalls of the gate electrodes, P type impurity ions are introduced into the PMOS area and N type impurity ions are introduced into the NMOS area.

Also, according to another aspect of the present invention, after gate electrodes and their sidewall insulating layers are formed, first and second P type impurity ions are introduced into a PMOS area of a semiconductor substrate with a mask covering the NMOS area. In this case, the first impurity ions are obliquely incident to the PMOS area, and the second impurity ions are approximately perpendicularly incident to the PMOS area. Similarly, third and fourth N type impurity ions are introduced into an NMOS area of the semiconductor substrate with a mask covering the PMOS area. In this case, the third impurity ions are obliquely incident to the PMOS area, and the fourth impurity ions are approximately perpendicularly incident to the PMOS area.

BRIEF DESCRIPTION OF THE DRAWINGS

The present invention will be more clearly understood from the description as set forth below, as compared with the prior art, with reference to the accompanying drawings, wherein:

FIG. 4 is a graph showing a concentration of impurities in the substrate (well) of the PMOS transistor of FIG. 2I;

DESCRIPTION OF THE PREFERRED EMBODIMENTS

Before the description of the preferred embodiments, a prior art method for manufacturing an LDD type CMOS device will be explained with reference to FIGS. 1A through 1I.

Figure 1A:
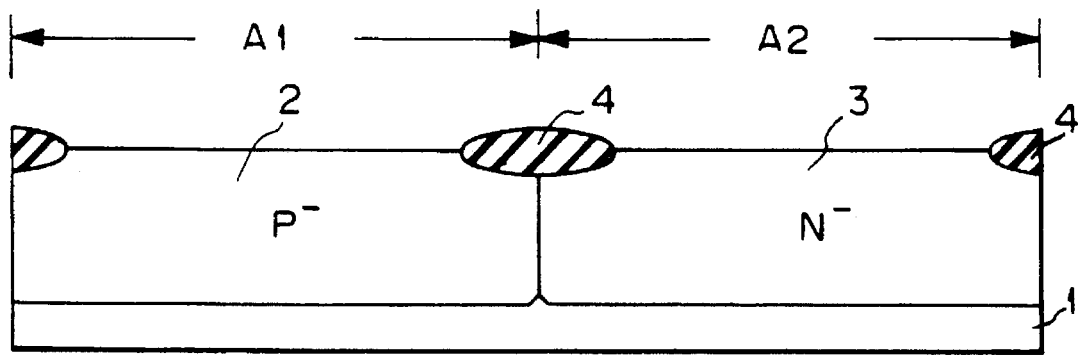
FIGS. 1A through 1I are cross-sectional views illustrating a prior art method for manufacturing a CMOS device.

First, referring to FIG. 1A, a P type well 2 and an N type well 3 are formed on a silicon. monocrystalline substrate 1. Then, a thick field oxide layer 4 is grown by using a local oxidation of silicon (LOCOS) process to partition an NMOS forming area A1 for an N channel transistor and a PMOS forming area A2 for a P channel transistor.

Figure 1B:
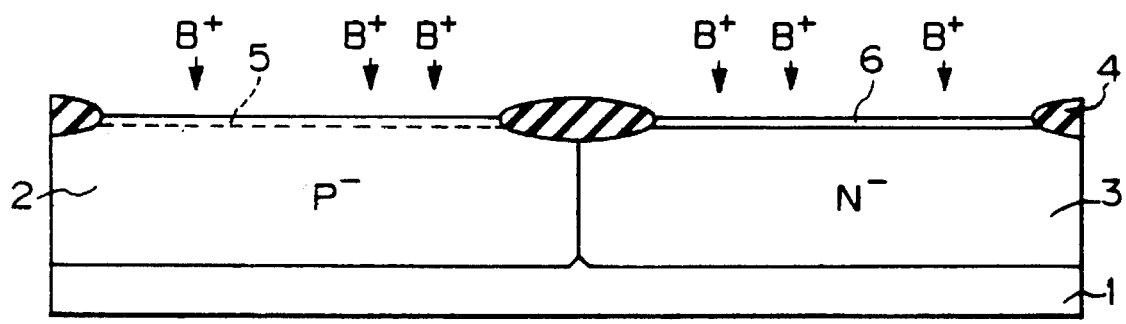

Next, referring to FIG. 1B, about 2 to $6 \times 10^{12}$ boron ions/cm$^2$ are implanted at a low energy such as 10 to 30 keV into the NMOS forming area A1 and the PMOS forming area A2 simultaneously of individually. Note that a work function between a phosphorus including gate electrode (which will be explained later) and the P type well 2 is different from a work function between the phosphorus including gate electrode and the N type well 3, and as a result, the threshold voltage of the NMOS transistor is smaller than that of the PMOS transistor. This difference in threshold voltage is compensated for by the implantation of boron ions. Thus, a thin P type impurity region 5 is formed in the P type well 2, and a thin P type impurity region 6 is formed in the N type well 3. In this case, no PN junction is created in the NMOS forming area A1, while a PN junction is created in the PMOS forming area A2.

Figure 1C:
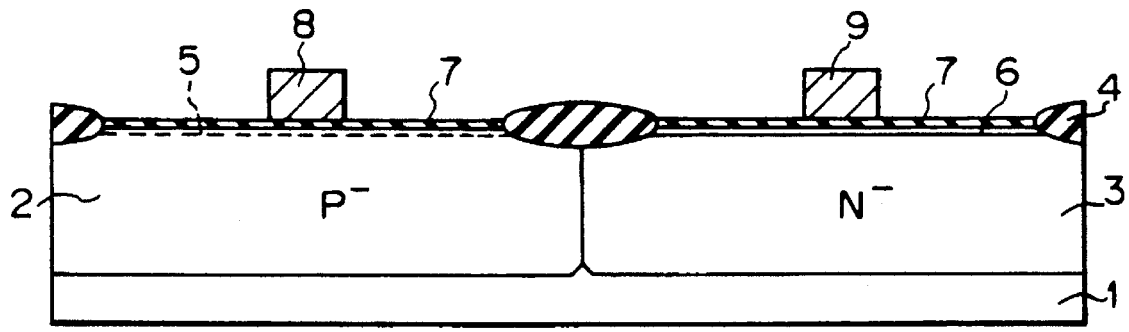

Next, referring to FIG. 1C, the P type well 2 and the type N well 3 are thermally oxidized to form a gate oxide layer 7 thereon. Further, a polycrystalline silicon layer including N type impurities such as phosphorus is formed by a chemical vapor deposition (CVD) process, then, the polycrystalline silicon layer is patterned by a photolithography process, and as a result, gate electrodes 8 and 9 are formed on the NMOS forming area A1 and the PMOS forming area A2, respectively, of the gate oxide layer 7.

Figure 1D:
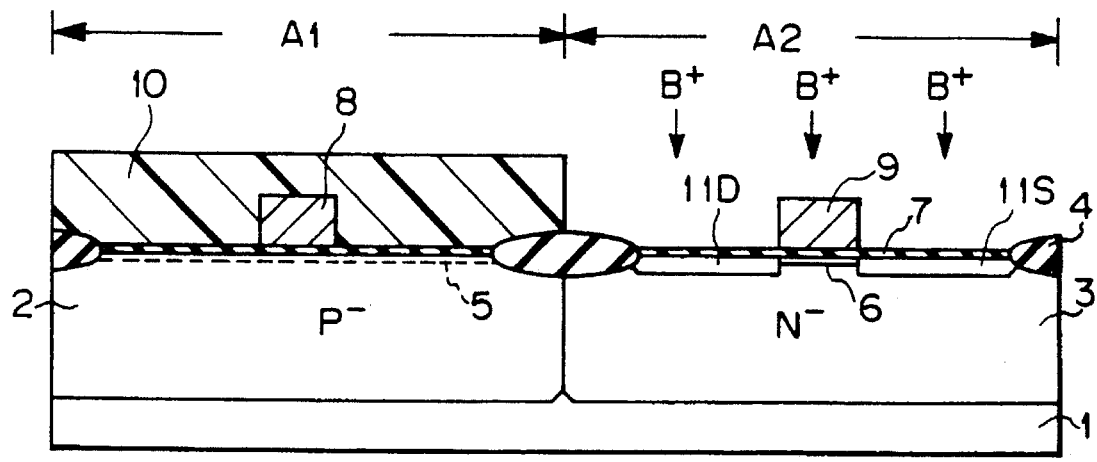

Next, referring to FIG. 1D, a photoresist pattern 10 is formed to cover the NMOS forming area A1. Then, boron ions are implanted into source/drain regions of the PMOS transistor to form lean P type impurity regions 11S and 11D which serve as parts of an LDD structure. Then, the photoresist pattern 10 is removed.

Figure 1E:
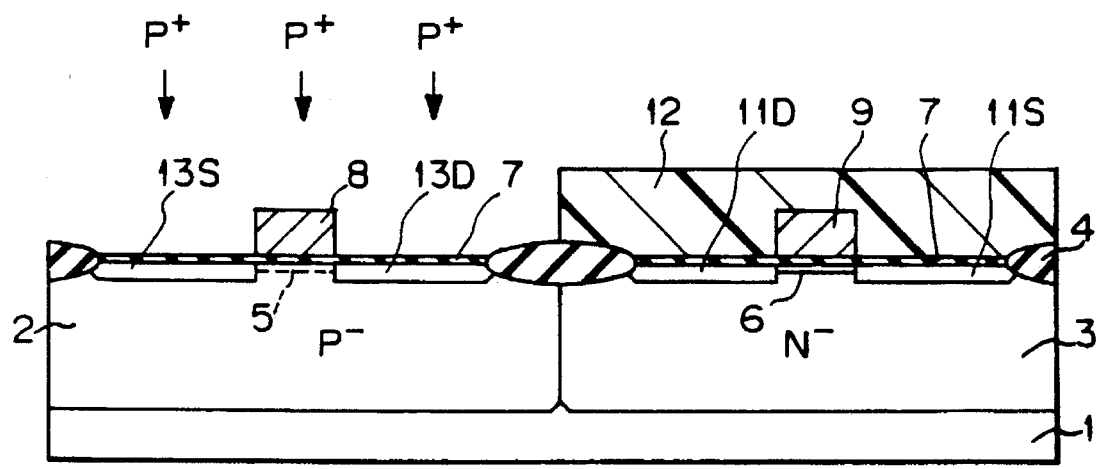

Similarly, referring to FIG. 1E, a photoresist pattern 11 is formed to cover the PMOS forming area A2. Then, phosphorous ions are implanted into source/drain regions of the NMOS transistor to form lean N type impurity regions 13S and 13D which serve as parts of an LDD structure. Then, the photoresist pattern 12 is removed.

Figure 1F:
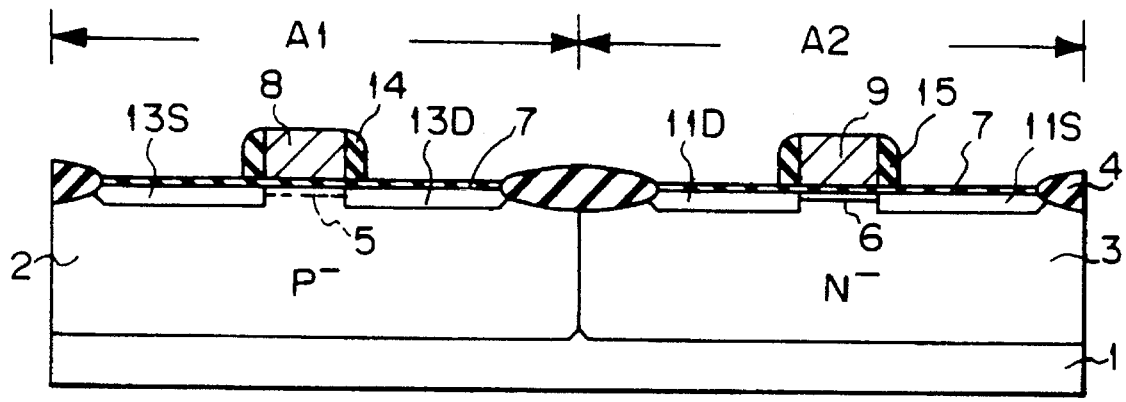

Next, referring to FIG. 1F, a silicon oxide layer is formed on the entire surface by a CVD process, and the silicon oxide layer is etched back by an anisotropic etching process. Thus, sidewall oxide layers 14 and 15 are left on sidewalls of the gate electrodes 8 and 9, respectively.

Figure 1G:
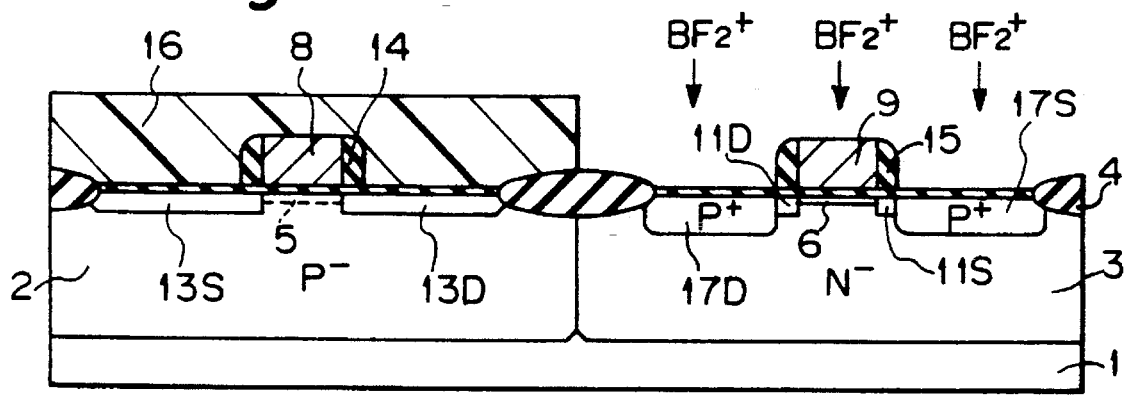

Next, referring to FIG. 1G, a photoresist pattern 16 is formed to cover the NMOS forming area A1. Then, boron fluoride ($BF_2$) ions are implanted into source/drain regions of the PMOS transistor to form rich P type impurity regions 17S and 17D. Then, the photoresist pattern 16 is removed.

Figure 1H:
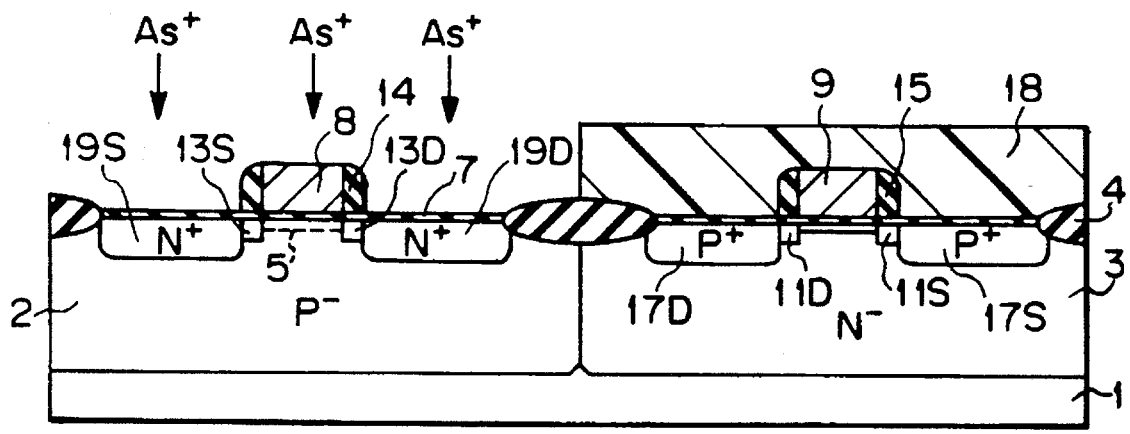

Similarly, referring to FIG. 1H, a photoresist pattern 18 is formed to cover the PMOS forming area A2. Then, arsenic ions are implanted into source/drain regions of the NMOS transistor to form rich N type impurity regions 19S and 19D. Then, the photoresist pattern 18 is removed.

Then, an annealing operation is carried out to activate the implanted ions.

Figure 1I:
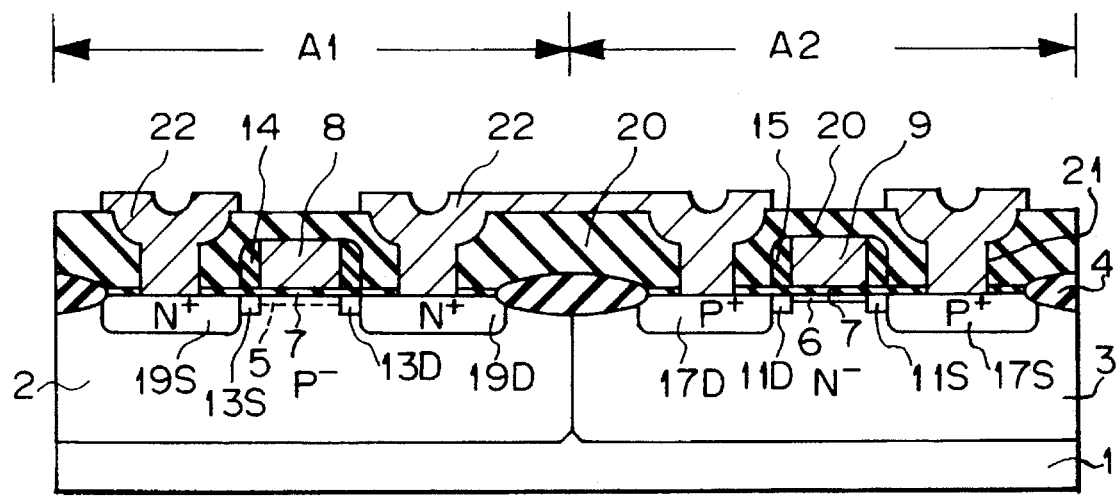

Finally, referring to FIG. 1I, an interlayer 20 is formed, and contact holes 21 are formed in the interlayer 20. Then, an aluminum connection layer 22 is formed and is patterned, thus completing the CMOS device.

In the prior art manufacturing method as shown in FIGS. 1A through 1I, four photolithography processes for the photoresist patterns 10, 12, 16 and 18 are required, which increases the manufacturing cost of the CMOS device.

In the CMOS device as shown in FIGS. 1A through 1I, since use is made of N type polycrystalline silicon as the gate electrodes 8 and 9, the NMOS transistor is of a surface channel type, while the PMOS transistor is of a buried channel type. In the buried channel type transistor, carriers flow deeper than an interface between the gate oxide layer and the silicon substrate (well). Therefore, the buried channel type transistor is not subjected to the surface scattering as compared with the surface channel type transistor. Also, the mobility of carriers is larger in the buried channel type transistor than in the surface channel type transistor. These are advantages of the buried channel type transistor.

On the other hand, the buried channel type transistor has the following disadvantage. That is, since the source region, the channel region and the drain region are connected by the same type impurity region, a punch through phenomenon may occur, i.e., the drain voltage may push up the potential energy at the boundary between the source region and the channel region so that a current flows between the source region and the drain region. Note that, in the buried channel transistor, since a punch through phenomenon may occur in a surface of a semiconductor substrate, such a punch through phenomenon is called a surface punch through phenomenon. On the other hand, in the surface channel transistor, since a punch through phenomenon may occur in a deep portion of a semiconductor substrate, such a punch through phenomenon is called a substrate punch through phenomenon.

In order to suppress the punch through phenomenon of a PMOS transistor without increasing the manufacturing steps, an N type pocket region is formed in the PMOS transistor (see: LP-A-HEI2-22862). In this case, ion implantation for the N type pocket region also forms an LDD structure of an NMOS transistor, and a photolithography process for the formation of the NMOS transistor is unnecessary. In this prior art method, however when an LDD structure is applied to the PMOS transistor, it is impossible to omit a photolithography process for the formation of the LDD structure of the PMOS transistor although the photolithography process for the formation of the LDD structure of the NMOS transistor is omitted. Also, this prior art method cannot suppress a punch through phenomenon in the NMOS transistor.

A first embodiment of the present invention will now be explained with reference to FIGS. 2A through 2I.

Figure 2A:
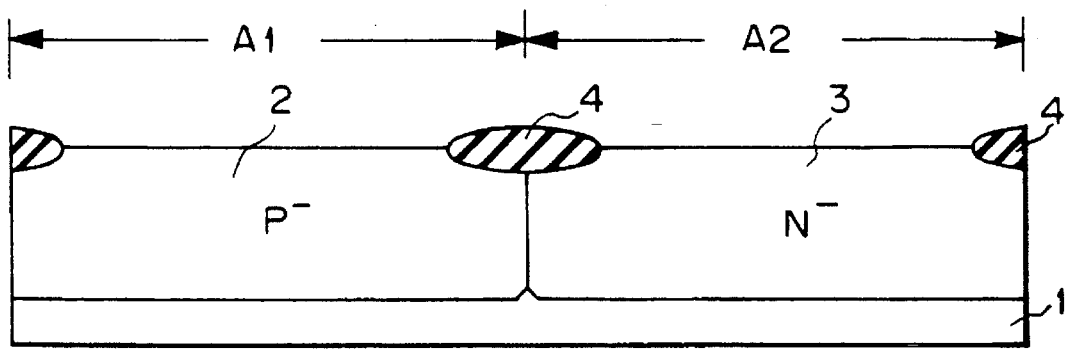
FIGS. 2A through 2I are cross-sectional views illustrating a first embodiment of the method for manufacturing a CMOS device according to the present invention.

First, referring to FIG. 2A, in the same way as shown in FIG. 1A, a P type well 2 and an N type well 3 are formed on a silicon monocrystalline substrate 1. Then, a thick field oxide layer 4 is grown by using a LOCOS process, to partition an NMOS forming area A1 for an N channel transistor and a PMOS forming area A2 for a P channel transistor.

Figure 2B:
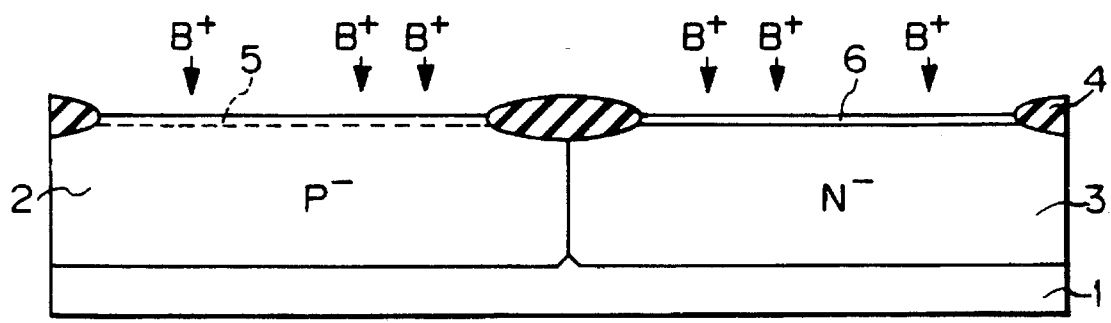

Next, referring to FIG. 2B, in the same way as shown FIG. 1B, about 2 to $6\times10^{12}$ boron ions/$cm^2$ are implanted at a low energy such as 10 to 30 keV into the NMOS forming area A1 and the PMOS forming area A2 simultaneously or individually. As a result, the threshold voltages of the PMOS transistor and the NMOS transistor are adjusted.

Figure 2C:
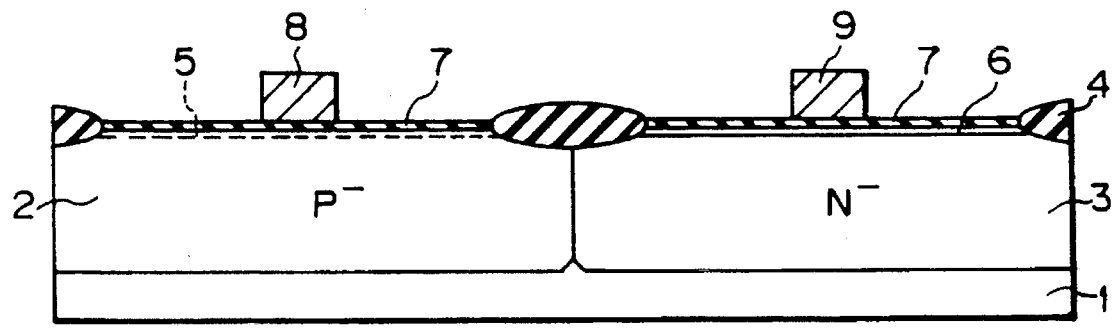

Next, referring to FIG. 2C, in the same way as shown in FIG. 1C, the P type well 2 and the N type well 3 are thermally oxidized to form a gate oxide layer 7 thereon. Further, a polycrystalline silicon layer including N type impurities such as phosphorus is formed by a CVD process. Then, the polycrystalline silicon layer is patterned by a photolithography process, and as a result, gate electrodes 8 and 9 are formed on the NMOS forming area A1 and the PMOS forming area A2, respectively, of the gate oxide layer 7.

Figure 2D:
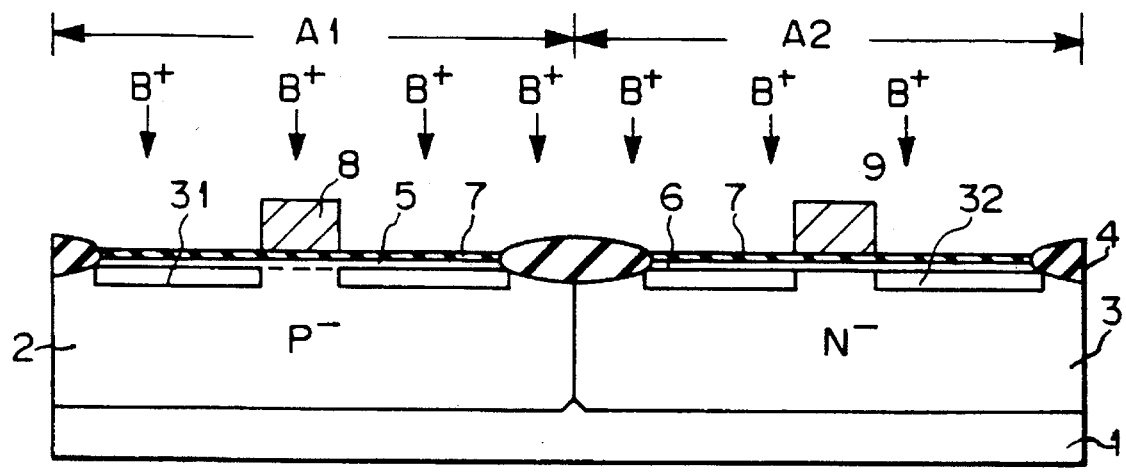

Next, referring to FIG. 2D, about $5\times10^{12}$ to $3\times10^{13}$ P type impurity ions such as boron ions/$cm^2$ are implanted at an energy of about 20 to 40 keV, to form lean P type impurity regions 31 and 32. In this case, the P type impurity region 31 serves as a P type pocket region of the NMOS transistor, while the P type impurity region 32 serves as a lean part of the LDD structure of the PMOS transistor.

Figure 2E:
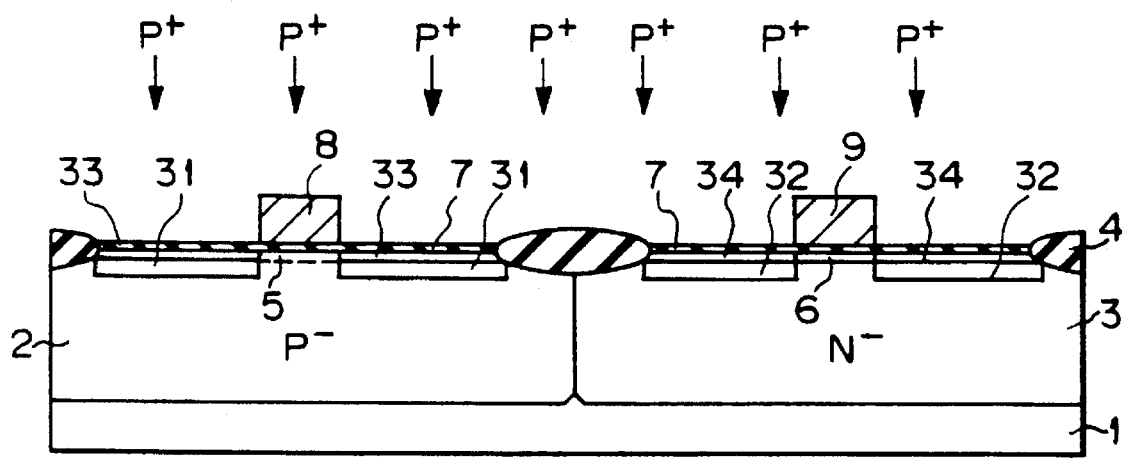

Next, referring to FIG. 2E, about $1\times10^{12}$ to $1\times10^{14}$ N type impurity ions such as phosphorous ions/$cm^2$ are implanted at an energy of about 20 to 40 keV, to form lean N the impurity regions 33 and 34. In this case, the N type impurity regions 33 and 34 are shallower than the P type impurity regions 31 and 32. That is, the implantation energy of boron ions and phosphorous ions are determined so that the range of phosphorous ions is smaller than that of boron ions. Also, the N type impurity region 33 serves as a lean part of the LDD structure of the NMOS transistor, while the N type impurity region 34 serves as an N type pocket region of the PMOS transistor.

Figure 2F:
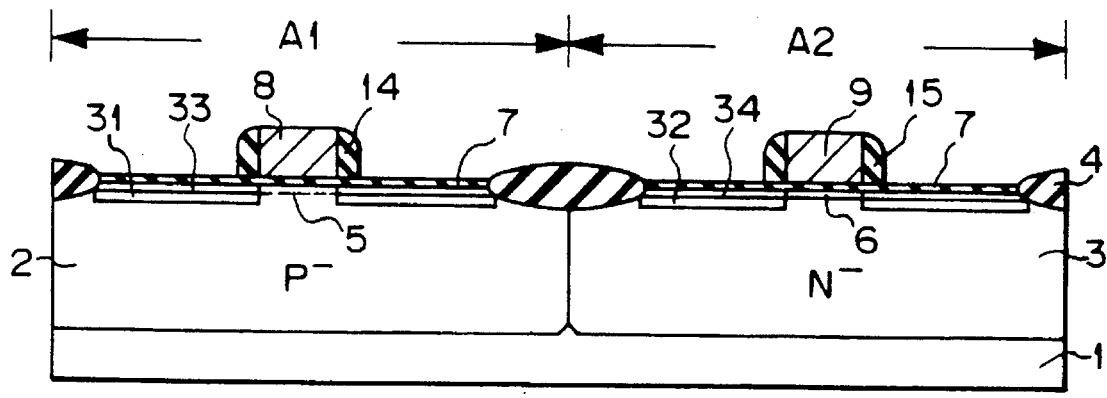

Next, referring to FIG. 2F, in the same way as shown in FIG. 1F, a silicon oxide layer is formed on the entire surface by a CVD process, and the silicon oxide layer is etched back by an anisotropic etching process. Thus, sidewall oxide layers 14 and 15 are left on sidewalls of the gate electrodes 8 and 9, respectively.

Figure 2G:
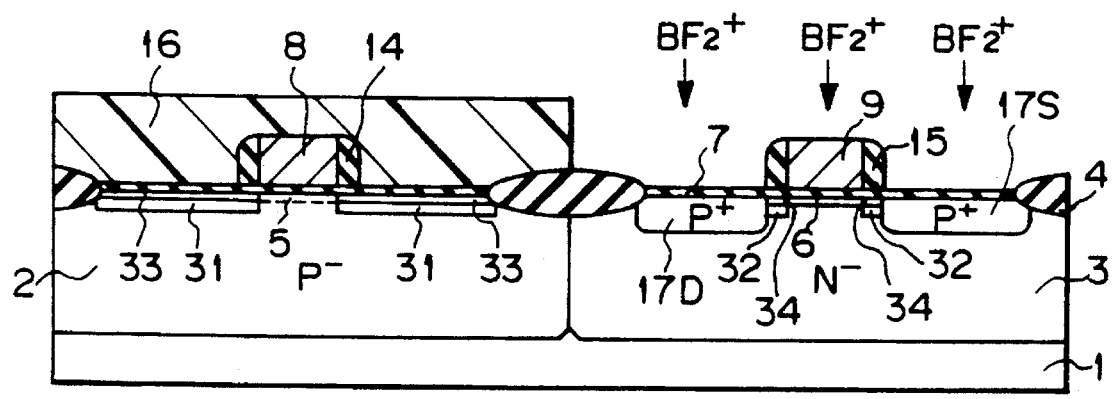

Next, referring to FIG. 2G, in the same way as shown in FIG. 1G, a photoresist pattern 16 is formed to cover the NMOS forming area A1. Then, boron fluoride ($BF_2$) ions are implanted into source/drain regions of the PMOS transistor to form rich P type impurity regions 17S and 17D. Then, the photoresist pattern 16 is removed.

Figure 2H:
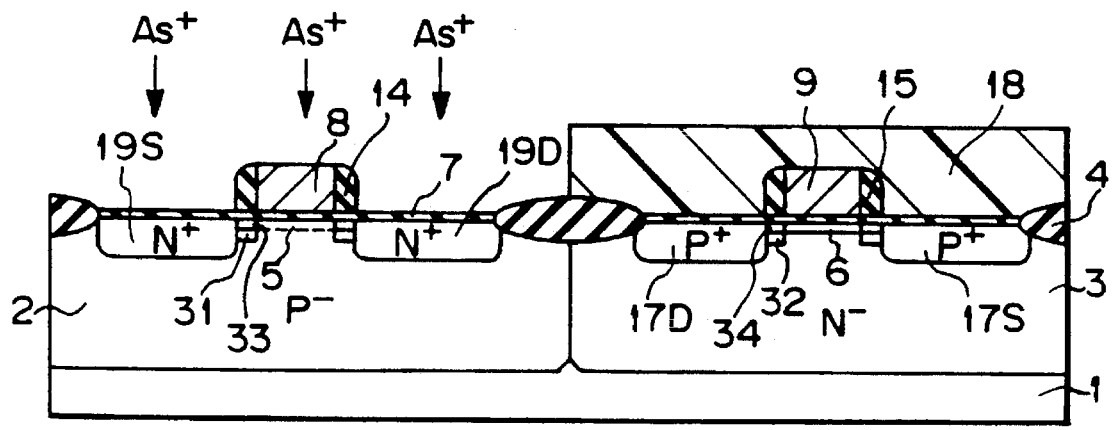

Similarly, referring to FIG. 2H, in the same way as shown in FIG. 1H, a photoresist pattern 18 is formed to cover the PMOS forming area A2. Then, arsenic ions are implanted into source/drain regions of the NMOS transistor to form rich N type impurity regions 19S and 19D. Then, the photoresist pattern 18 is removed.

Then, an annealing operation is carried out to activate the implanted ions.

Figure 2I:
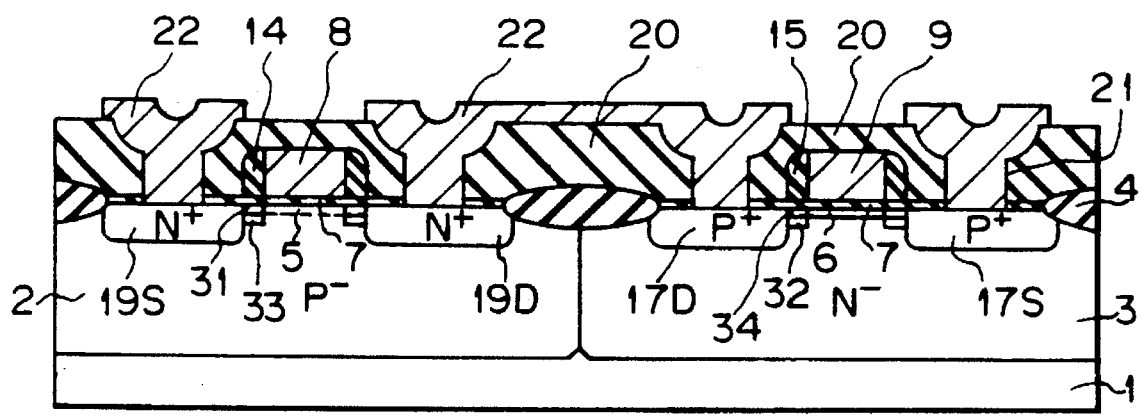

Finally, referring to FIG. 2I, in the same way as shown in FIG. 1I, an interlayer 20 is formed, and contact holes 21 are formed in the interlayer 20. Then, an aluminum connection layer 22 is formed and is patterned, thus completing a CMOS device.

In the first embodiment as shown in FIGS. 2A through 2I, only two photolithography processes for the photoresist patterns 16 and 18 are required, which reduces the manufacturing cost of the CMOS device.

In the first embodiment, as stated above, the P type impurity region 31 serves as the P type pocket region for suppressing the spread of potential by the N type impurity region 33, and the N type impurity region 34 serves as the N type pocket region for suppressing the spread of potential by the P type impurity region 32.

Figure 3:
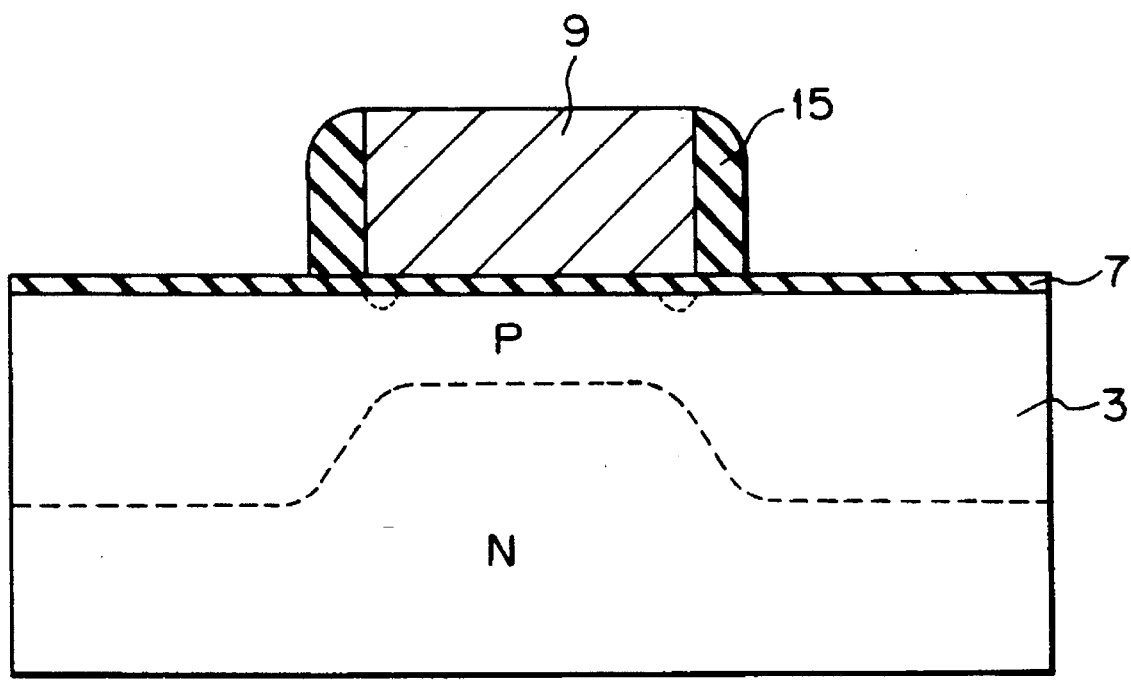
FIG. 3 is a cross-sectional view illustrating a PN junction of the PMOS transistor of FIG. 2I.

FIG. 3 shows a simulation result of a PN junction portion of the PMOS transistor manufactured by the first embodiment. The N type surface pockets formed below both sides of the gate electrode 9 effectively suppress the spread of potential at the surface of the N type well 3. Note that the P type impurity regions 6, 32 17S and 17D of FIG. 2I are spread by the annealing operation to cover the N type surface pockets. Also, the surface pockets may remain in a P type in accordance with the parameters of the elements; however, even in this case, such surface pockets are very lean P type impurity regions, thus suppressing the spread of potential.

FIG. 4 shows a concentration of impurities in the substrate (well) of the PMOS transistor of FIG. 2I. That is, there is generated a N type impurity region or an P type impurity region below the center of the gate electrode 9. Such a P type impurity region or an N type impurity region is leaner than the channel region, i.e., the P type impurity region 32.

Figure 5A:
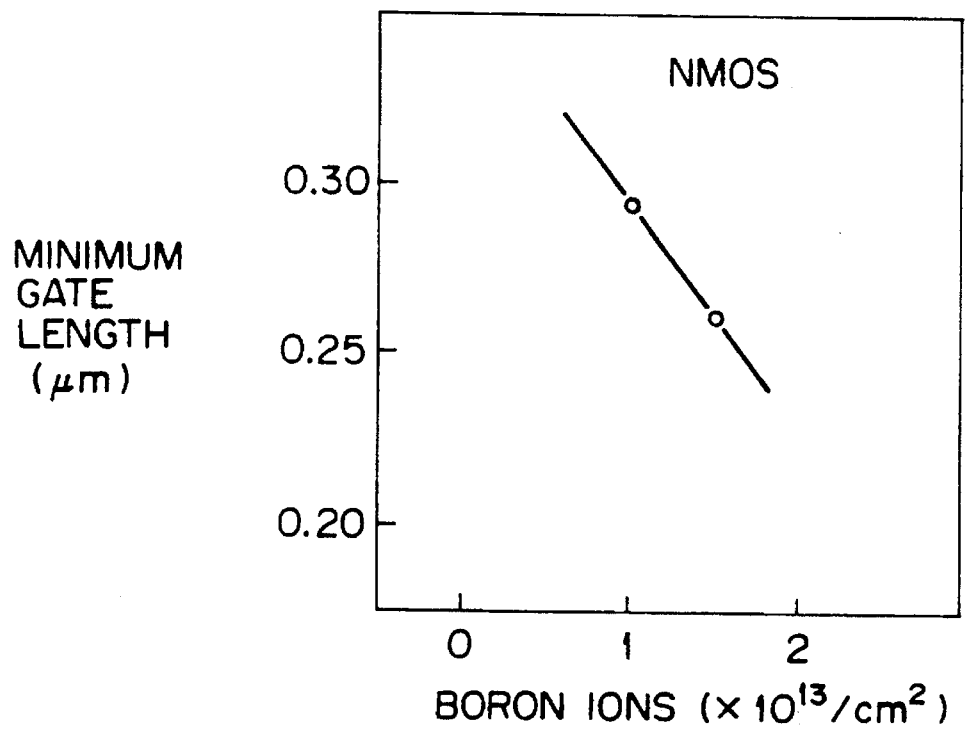
FIGS. 5A and 5B are graphs showing minimum gate length characteristics according to the first embodiment of the present invention.
Figure 5B:
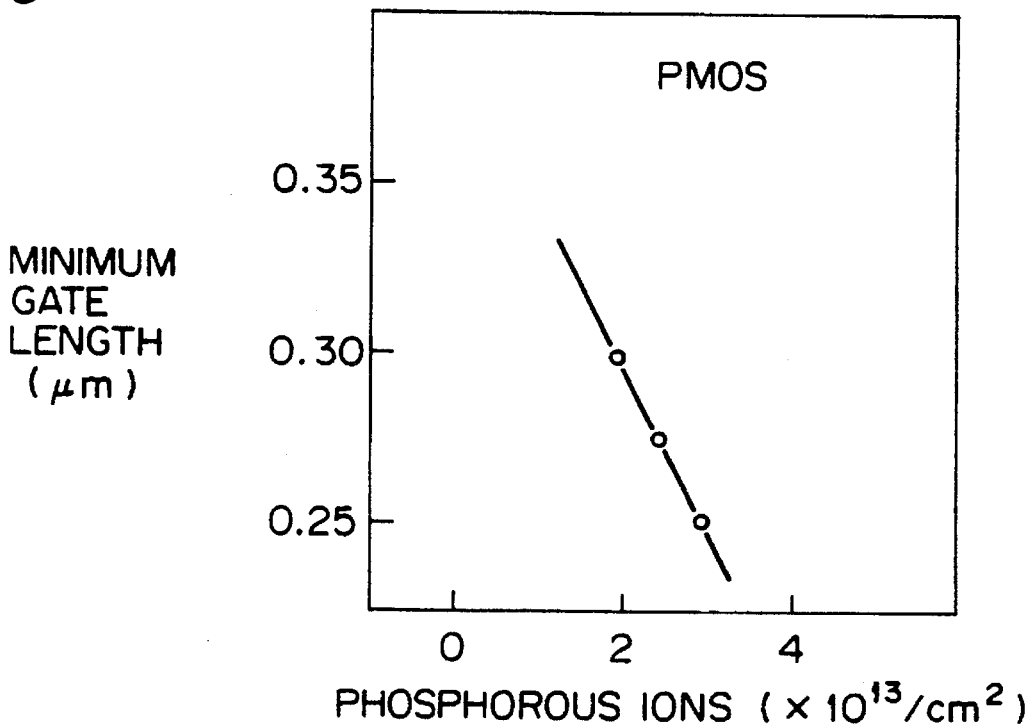

FIG. 5A is a graph showing a relationship between the implantation amount of boron ions into the P type pockets 31 and a minimum gate length of the NMOS transistor obtained by the first embodiment, and FIG. 5B is a graph showing a relationship between the implantation amount of phosphorous ions into the N type pockets 34 and a minimum gate length of the PMOS transistor obtained by the first embodiment. Thus, since the pockets are formed in the NMOS transistor and the PMOS transistor, gate lengths thereof can be fined, thus increasing the integration of the CMOS device.

In the first embodiment, although the N type impurity regions 19S and 19D are formed after the formation of the P type impurity regions 17S and 17D, it is possible to form the P type impurity regions 17S and 17D after the formation of the N type impurity regions 19S and 19D.

Thus, according to the first embodiment of the present invention, the P type pockets for effectively suppressing the substrate punch through phenomenon of the NMOS transistor and the N type pockets for effectively suppressing the surface punch through phenomenon of the PMOS transistor can be manufactured without additional photolithography processes, and also, the number of photolithography processes for the LDD structure can be reduced. Thus, the manufacturing cost can be reduced. Particularly, the suppression of the surface punch through phenomenon in the buried PMOS transistor contributes to the integration of the CMOS device.

A second embodiment of the present invention will now be explained with reference to FIGS. 6A through 6I.

Figure 6A:
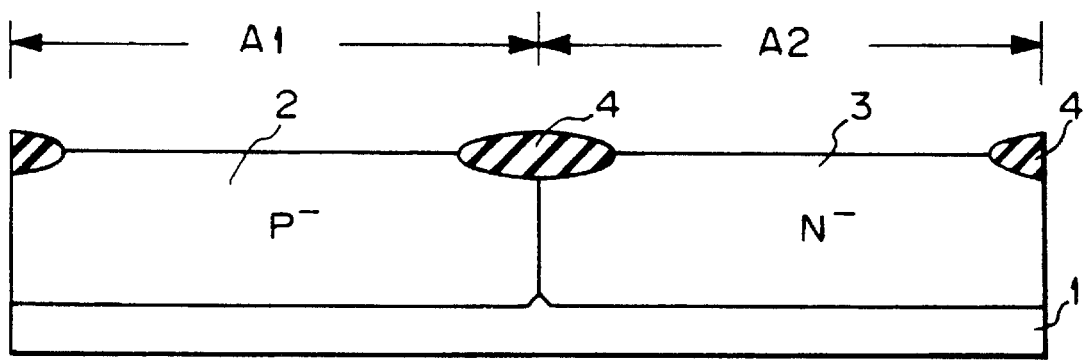
FIGS. 6A through 6I are cross-sectional views illustrating a second embodiment of the method for manufacturing a CMOS device according to the present invention.

First, referring to FIG. 6A, in the same way as shown in FIG. 1A, a P type well 2 and an N type well 3 are formed on a silicon monocrystalline substrate 1. Then, a thick field oxide layer 4 is grown by using an LOCOS process, to partition an NMOS forming area A1 for an N channel transistor and a PMOS forming area A2 for a P channel transistor.

Figure 6B:
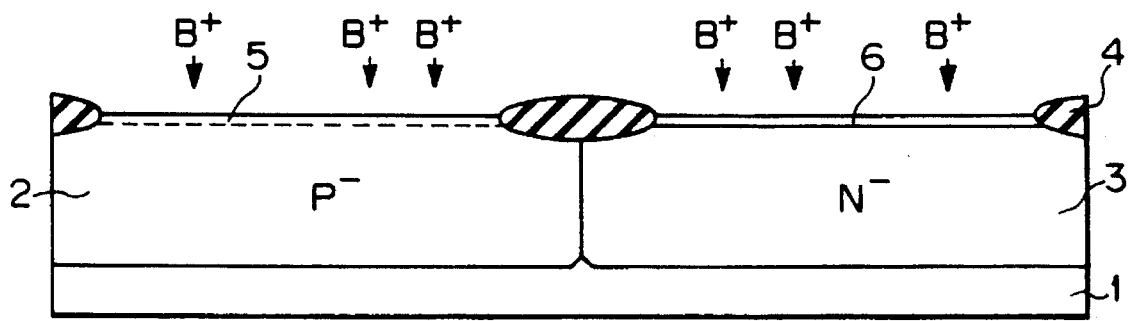

Next, referring to FIG. 6B, in the same way as shown FIG. 1B, about 2 to $6 \times 10^{12}$ boron ions/cm$^2$ are implanted at a low energy such as 10 to 30 keV into the NMOS forming area A1 and the PMOS forming area A2 simultaneously or individually. As a result, the threshold voltages of the PMOS transistor and the NMOS transistor are adjusted.

Figure 6C:
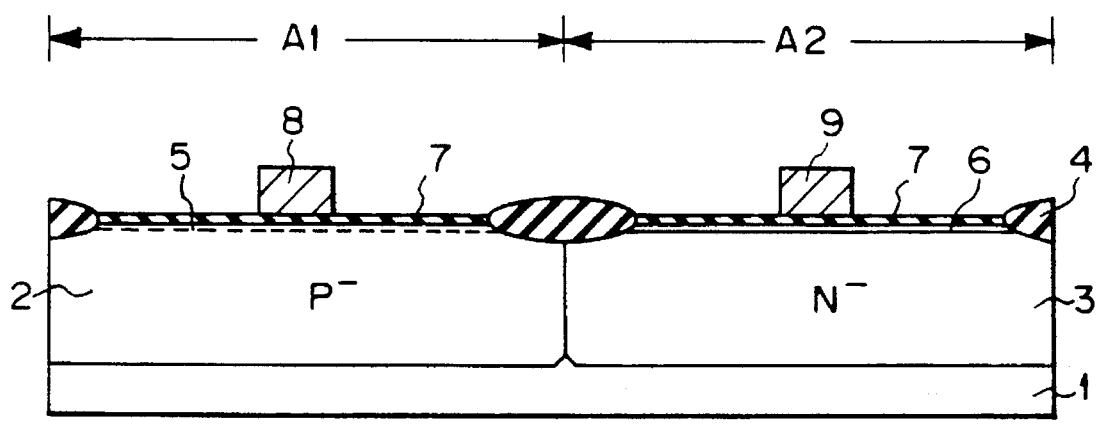

Next, referring to FIG. 6C, in the same way as shown in FIG. 1C, the P type well 2 and the N type well 3 are thermally oxidized to form a gate oxide layer 7 thereon. Further, a polycrystalline silicon layer including N type impurities such as phosphorus is formed by a CVD process. Then, the polycrystalline silicon layer is patterned by a photolithography process, and as a result, gate electrodes 8 and 9 are formed on the NMOS forming area A1 and the PMOS forming area A2, respectively, of the gate oxide layer 7.

Figure 6D:
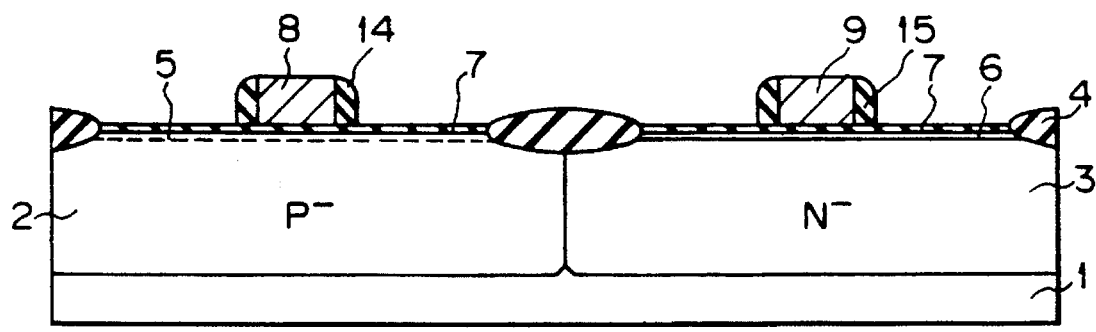

Next, referring to FIG. 6D, in the same way as shown in FIG. 1F, a silicon oxide layer is formed on the entire surface by a CVD process, and the silicon oxide layer is etched back by an anisotropic etching process. Thus, sidewall oxide layers 14 and 15 are left on sidewalls of the gate electrodes 8 and 9, respectively.

Figure 6E:
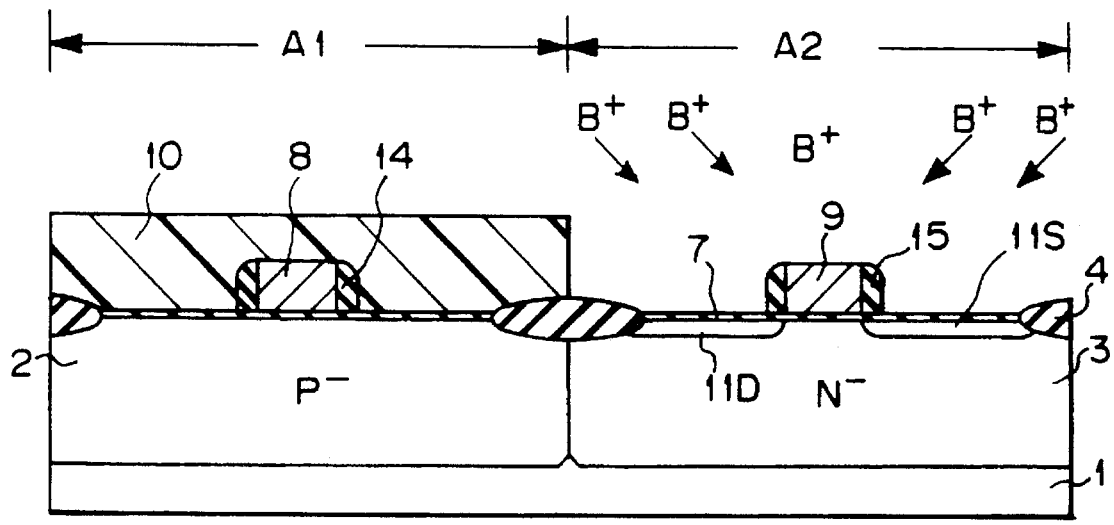

Next, referring to FIG. 6E, a photoresist pattern 10 is formed to cover the NMOS forming area A1. Then, about $1 \times 10^{13}$ to $1 \times 10^{14}$ boron ions/cm$^2$ are implanted at an energy of about 30 to 40 keV and at an incident angle of about 30° to 45° into source/drain regions of the PMOS transistor to form lean P type impurity regions 11S and 11D which serve as parts of an LDD structure. Thus, since the implantation of boron ions is oblique to the semiconductor substrate 1, the boron ions penetrates beneath the sidewall oxide layers 15. Note that the energy of implantation of boron ions is determined so that the boron ions are not introduced into the gate oxide layer 7 beneath the gate electrode 9.

Figure 6F:
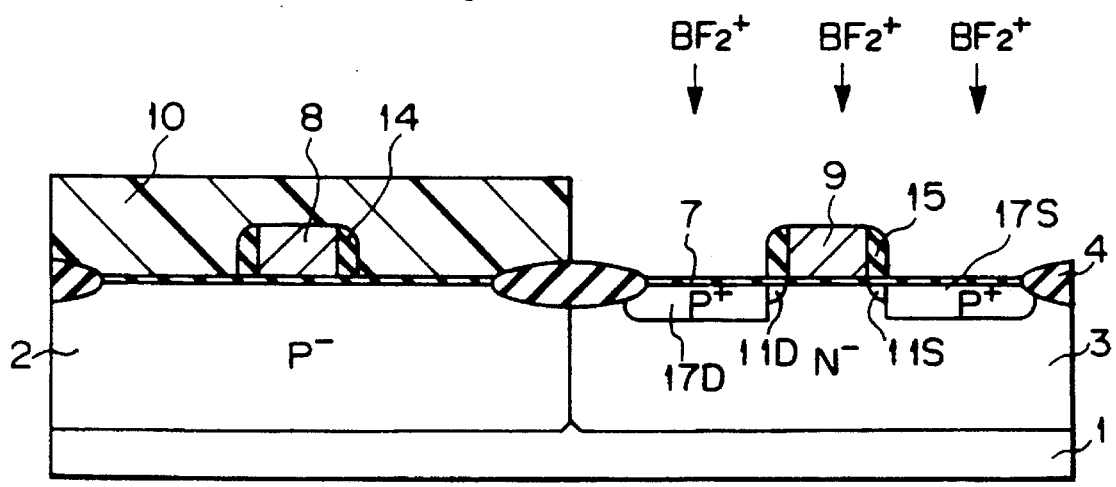

Next, referring to FIG. 6F, in the same way as shown in FIG. 1G, about $1 \times 10^{15}$ to $5 \times 10^{15}$ boron fluoride (BF$_2$) ions/cm$^2$ are implanted at an energy of about 50 to 70 keV and at an approximately normal angle into source/drain regions of the PMOS transistor to form rich P type impurity regions 17S and 17D. Then, the photoresist pattern 10 is removed.

Figure 6G:
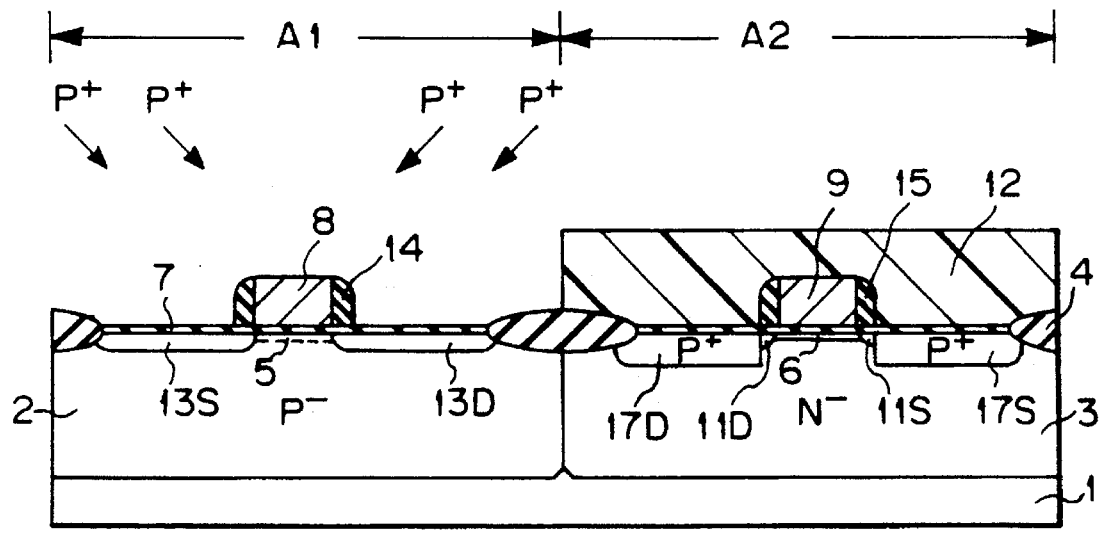

Next, referring to FIG. 6G, a photoresist pattern 12 is formed to cover the PMOS forming area A2. Then, about $1 \times 10^{13}$ to $1 \times 10^{14}$ phosphorous ions/cm$^2$ are implanted at an energy of about 60 to 90 keV and at an incident angle of about 30° to 45° into source/drain regions of the NMOS transistor to Form lean N type impurity regions 13S and 13D which serve as parts of an LDD structure. Thus, since the implantation of phosphorous ions is oblique to the semiconductor substrate 1, the phosphorous ions penetrate beneath the sidewall oxide layers 14. Nots that the energy of implantation of phosphorous ions is determined so that the phosphorous ions are not introduced into the gate oxide layer 7 beneath the gate electrode 8.

Figure 6H:
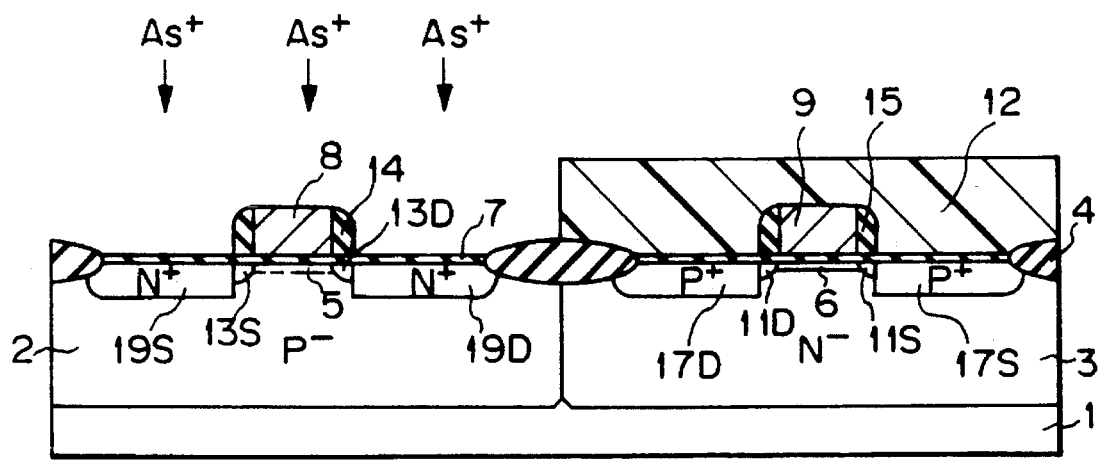

Next, referring to FIG. 6H, in the same way as shown in FIG. 1H, about $1 \times 10^{15}$ to $5 \times 10^{15}$ arsenic ions/cm$^2$ are implanted at an energy of about 50 to 70 keV and at an approximately normal angle into source/drain regions of the NMOS transistor to form rich N type impurity regions 19S and 19D. Then, the photoresist pattern 12 is removed.

Then, an annealing operation is carried out to activate the implanted ions.

Figure 6I:
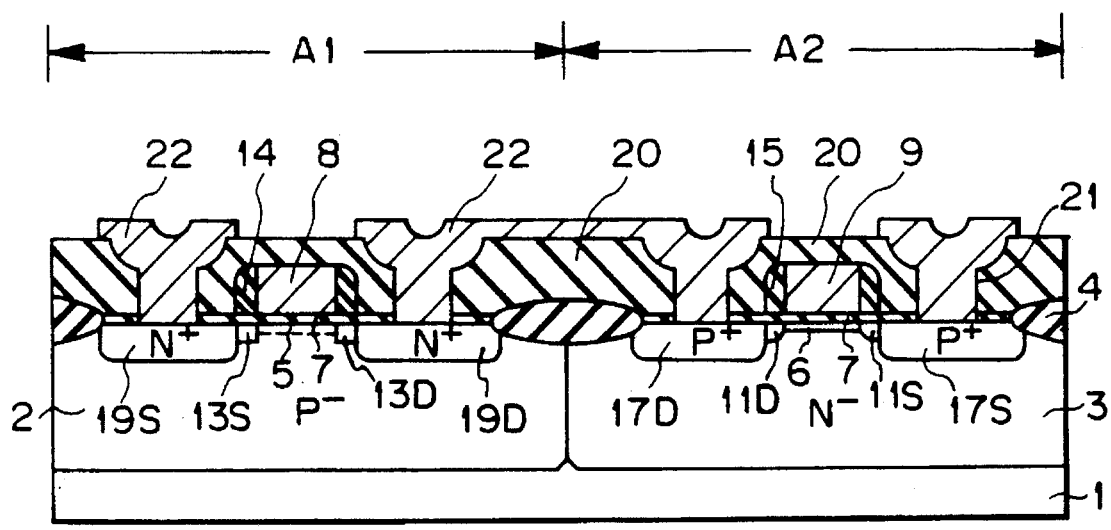

Finally, referring to FIG. 6I, in the same way as shown in FIG. 3I, an interlayer 20 is formed, and contact holes 21 are formed in the interlayer 20. Then, an aluminum connection layer 22 is formed and is patterned, thus completing a CMOS device.

In the second embodiment as shown in FIGS. 6A through 6I, only two photolithography processes for the photoresist patterns 10 and 12 are required, which reduces the manufacturing cost.

A third embodiment of the present invention will now be explained with reference to FIGS. 7A through 7H. In the third embodiment, an LDD structure is applied to the NMOS transistor, while an LDD structure is not applied to the PMOS transistor. Generally, the duration condition of the PMOS transistor is more lenient than that of the NMOS transistor. Therefore, an LDD structure is unnecessary for the PMOS transistor.

Figure 7A:
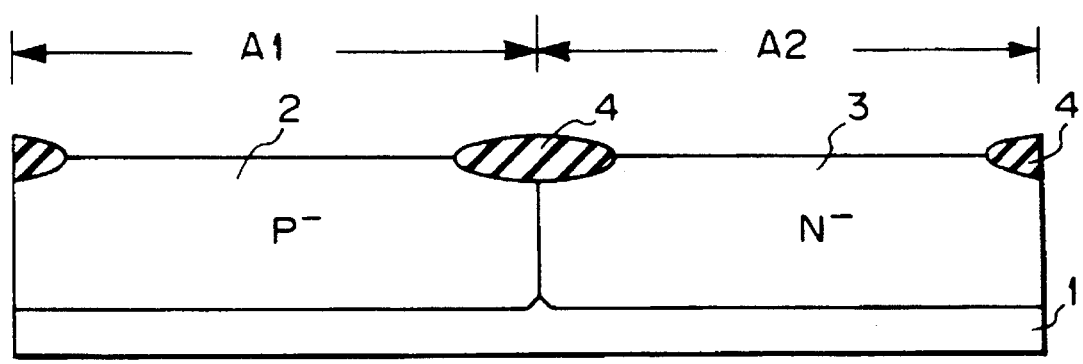
FIGS. 7A through 7H are cross-sectional views illustrating a third embodiment of the method for manufacturing a CMOS device according to the present invention.

First, referring to FIG. 7A, in the same way as shown in FIG. 6A, a P type well 2 and an N type well 3 are formed on a silicon monocrystalline substrate 1. Then, a thick field oxide layer 4 is grown by using a LOCOS process, to partition an NMOS forming area A1 for an N channel transistor and a PMOS forming area A2 for a P channel transistor.

Figure 7B:
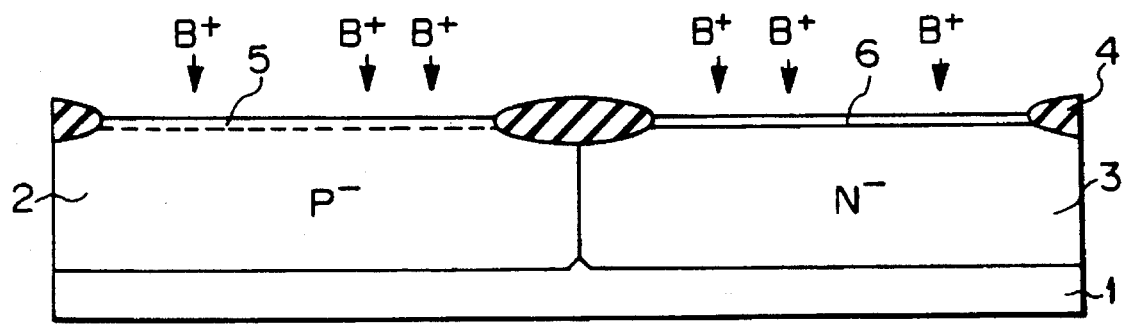

Next, referring to FIG. 7B, in the same way as shown FIG. 6B, about 2 to $6 \times 10^{12}$ boron ions/cm$^2$ are implanted at a low energy such as 10 to 30 keV into the NMOS forming area A1 and the PMOS forming area A2 simultaneously or individually. As a result, the threshold voltages of the PMOS transistor and the NMOS transistor are adjusted.

Figure 7C:
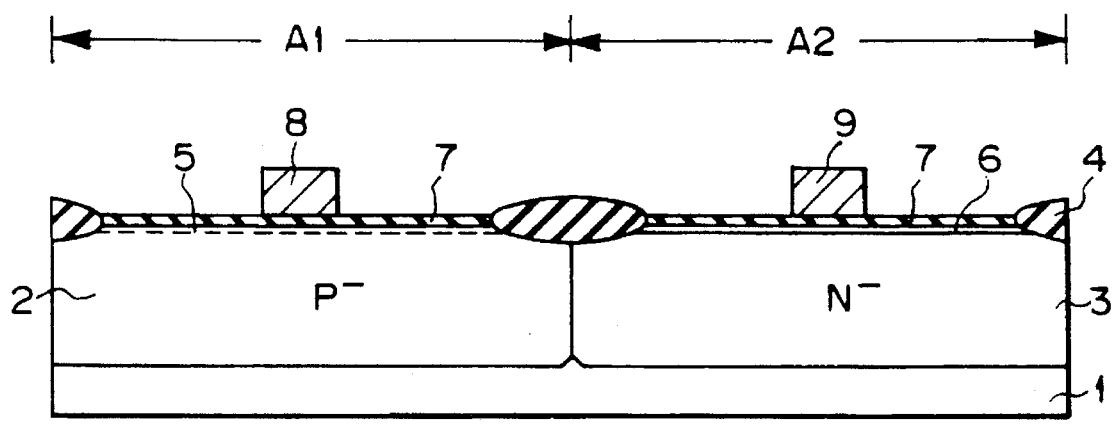

Next, referring to FIG. 7C, in the same way as shown in FIG. 6C, the P type well 2 and the N type well 3 are thermally oxidized to form a gate oxide layer 7 thereon. Further, a polycrystalline silicon layer including N type impurities such as phosphorus is formed by a CVD process. Then, the polycrystalline silicon layer is patterned by a photolithography process, and as a result, gate electrodes 8 and 9 are formed on the NMOS forming area A1 and the PMOS forming area A2, respectively, of the gate oxide layer 7.

Figure 7D:
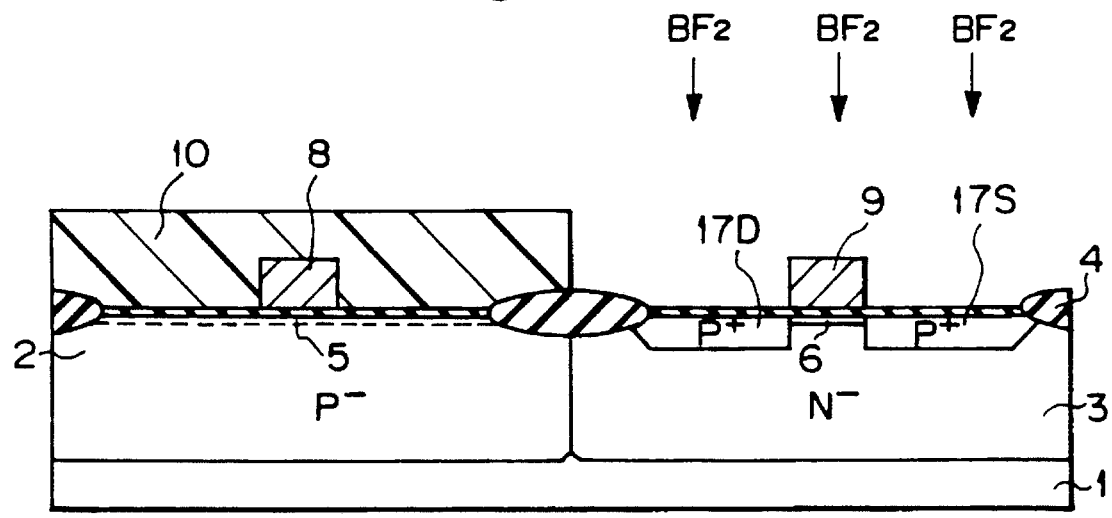

Next, referring to FIG. 7D, in a similar way as shown in FIG. 6F, a photoresist pattern 10 is formed to cover the NMOS forming area A1. Then, about $1 \times 10^{15}$ to $5 \times 10^{15}$ boron fluoride (BF$_2$) ions/cm$^2$ are implanted at an energy of about 50 to 70 keV into source/drain regions of the PMOS transistor to form rich P type impurity regions 17S and 17D which are not LDD-structured. Then, the photoresist pattern 10 is removed.

Figure 7E:
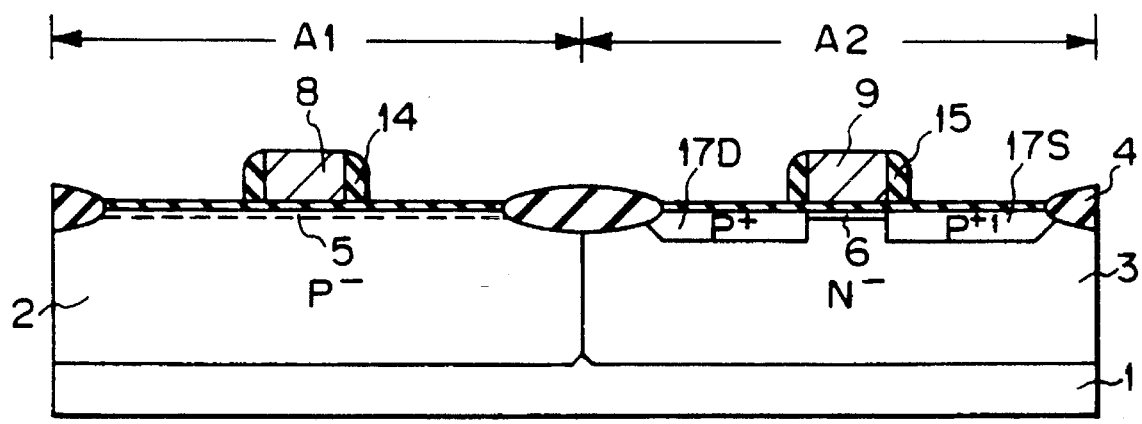

Next, referring to FIG. 7E, in the same way as shown in FIG. 6D, a silicon oxide layer is formed on the entire surface by a CVD process, and the silicon oxide layer is etched back by an anisotropic etching process. Thus, sidewall oxide layers 14 and 15 are left on sidewalls of the gate electrodes 8 and 9, respectively.

Figure 7F:
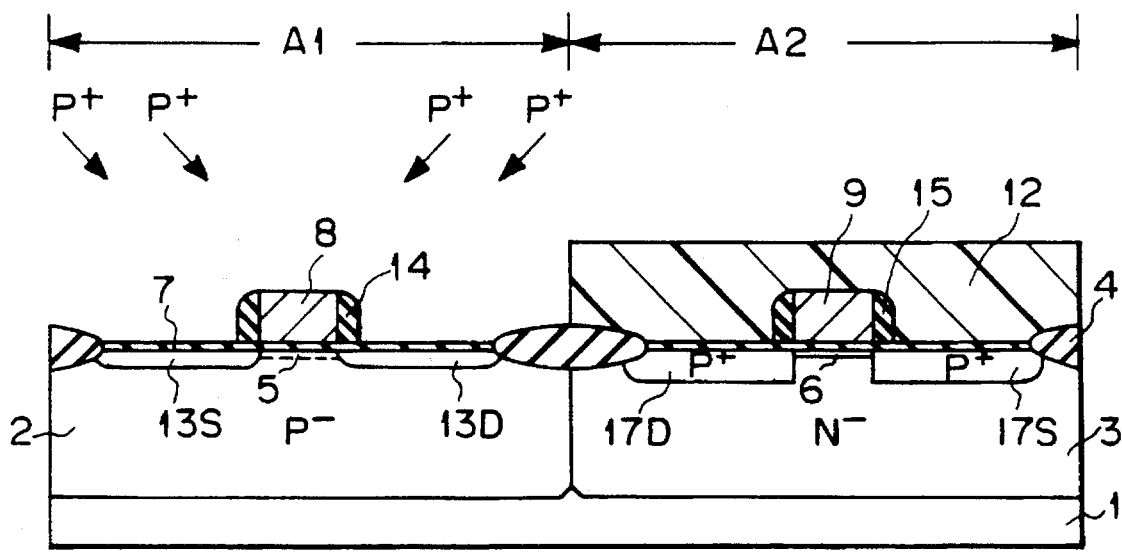

Next, referring to FIG. 7F, in the same way as shown FIG. 6G, a photoresist pattern 12 is formed to cover the PMOS forming area A2. Then, about $1 \times 10^{13}$ to $1 \times 10^{14}$ phosphorous ions/cm$^2$ are implanted at an energy of about 60 to 90 keV and at an incident angle of about 30° to 45° into source/drain regions of the NMOS transistor to form lean N type impurity regions 13S and 13D which serve as parts of an LDD structure. Thus, since the implantation of phosphorous ions is oblique to the semiconductor substrate 1, the phosphorous ions penetrate beneath the sidewall oxide layers 14. Note that the energy of implantation of phosphorous ions is determined so that the phosphorous ions are not introduced into the gate oxide layer 7 beneath the gate electrode 8.

Figure 7G:
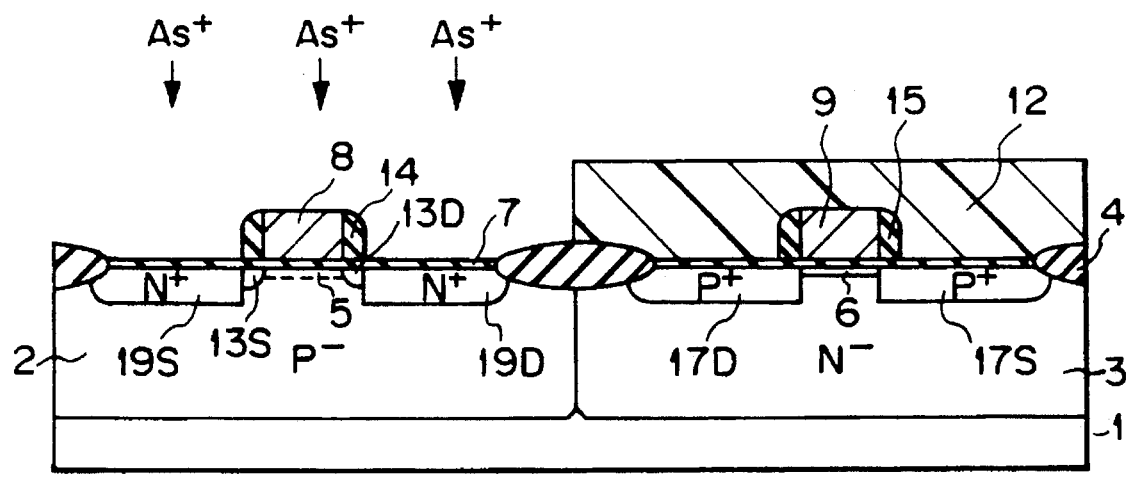

Next, referring to FIG. 7G, in the same way as shown in FIG. 6H, about $1 \times 10^{15}$ to $5 \times 10^{15}$ arsenic ions/cm$^2$ are implanted at an energy of about 50 to 70 keV and at an approximately normal angle into source/drain regions of the NMOS transistor to form rich N type impurity regions 19S and 19D. Then, the photoresist pattern 12 is removed.

Then, an annealing operation is carried out to activate the implanted ions.

Figure 7H:
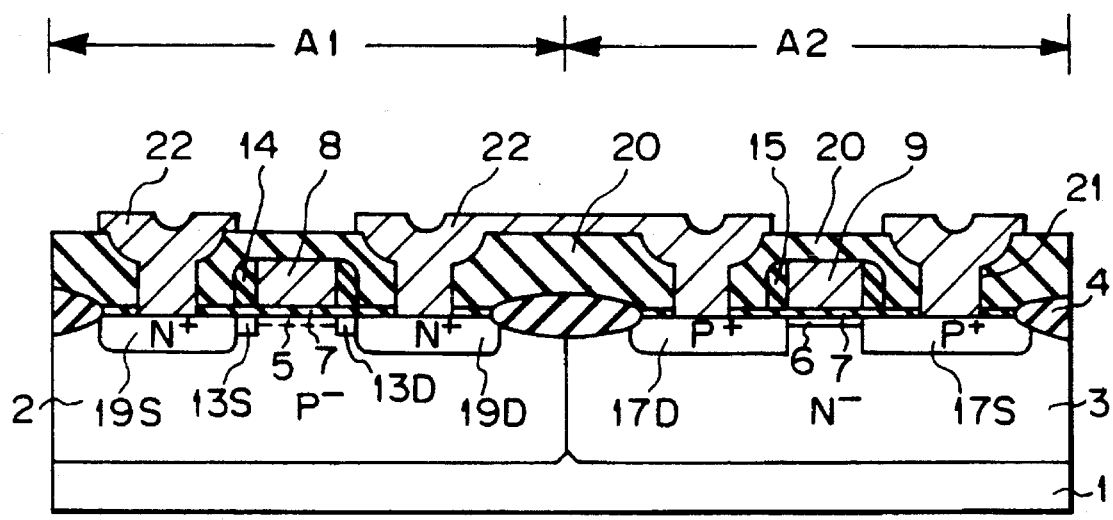

Finally, referring to FIG. 7H, in the same way as shown in FIG. 6I, an interlayer 20 is formed, and contact holes 21 are formed in the interlayer 20. Then, an aluminum connection layer 22 is formed and is patterned, thus completing a CMOS device.

Also, in the third embodiment as shown in FIGS. 7A through 7H, only two photolithography processes for the photoresist patterns 10 and 12 are required, which reduces the manufacturing cost of the CMOS device.

The second and third embodiments can be applied to the PMOS transistor and the NMOS transistor individually. That is, after a sidewall oxide layer is formed on a gate electrode, an oblique ion implantation is carried out to form a lean impurity region, and a perpendicular ion implantation is carried out to form a rich impurity region, thus obtaining a high duration LDD structure.

Also, in the second embodiment, although the N type impurity regions 19S and 19D are formed after the formation of the P type impurity regions 17S and 17D, it is possible to form the P type impurity regions 17S and 17D after the formation of the N type impurity regions 19S and 19D.

Note that it is known that an oblique ion implantation is adopted to form a lean impurity region for an LDD structure (see: JP-A-SHO 63-215075 and JP-A-HEI 2-310931). In this case, however, such an oblique ion implantation is carried out without formation of sidewall oxide layers, so that impurities are introduced into a gate oxide layer immediately beneath a gate electrode. As a result, a small current flows through the gate oxide layer, thus inviting deterioration of duration against voltage stress. Therefore, the reliability is reduced. Also, since the sidewall oxide layer is not present, the effective length of gates is so small that the gate electrode has to be lengthened, thus reducing the integration of the device. Therefore, the sidewall oxide layer is indispensible for an LDD structure.

As explained hereinbefore, according to the present invention, the manufacturing cost can be reduced, and also, the duration of the LDD structure can be increased.

I claim:

1. A method for manufacturing a buried channel type MIS transistor of a first conductivity type and a surface channel type MIS transistor of a second conductivity type opposite to said first conductivity type by using a semiconductor substrate, comprising the steps of:

forming a first semiconductor region of said second conductivity type for said buried channel type MIS transistor on said semiconductor substrate;

forming a second semiconductor region of said first conductivity type for said surface channel type MIS transistor on said semiconductor substrate;

forming first and second gate insulating layers on said first and second semiconductor regions, respectively;

forming first and second gate electrodes on said first and second gate insulating layers, respectively;

introducing first impurity ions of said first conductivity type and second impurity ions of said second conductivity type into said first and second semiconductor regions with a mask of said first and second gate electrodes, a range of said first impurity ions being larger than a range of said second impurity ions;

forming first and second sidewall insulating layers on sidewalls of said first and second gate electrodes, respectively;

introducing third impurity ions of said first conductivity type into said first semiconductor region with a mask of said first gate electrode and said first sidewall insulating layer and a first mask covering said second semiconductor region; and introducing fourth impurity ions of said second conductivity type into said second semiconductor region with a mask of said second gate electrode and said second sidewall insulating layer and a second mask covering said first semiconductor region.

2. A method as set forth in claim 1, wherein said first and second conductivity types are a P-type and an N-type, respectively.

3. A method as set forth in claim 1, wherein said first and second conductivity types are an N-type and a P-type, respectively.

4. A method for manufacturing a first MIS transistor of a first conductivity type and a second MIS transistor of a second conductivity type opposite to said first conductivity type by using a semiconductor substrate, comprising the steps of:

forming a first semiconductor region of said second conductivity type for said first MIS transistor on said semiconductor substrate;

forming a second semiconductor region of said first conductivity type for said second MIS transistor on said semiconductor substrate;

forming first and second gate insulating layers on said first and second semiconductor regions, respectively;

forming first and second gate electrodes on said first and second gate insulating layers, respectively;

forming first and second sidewall insulating layers on sidewalls of said first and second gate electrodes, respectively;

introducing first and second impurity ions of said first conductivity type into said first semiconductor region with a mask of said first gate electrode and said first sidewall insulating layer and a first photoresist mask covering said second semiconductor region, said first impurity ions being obliquely incident to said first semiconductor region and said second impurity ions being approximately perpendicularly incident to said first semiconductor region; and introducing third and fourth impurity ions of said second conductivity type into said second semiconductor region with a mask of said second gate electrode and said second sidewall insulating layer and a second photoresist mask covering said first semiconductor region, said third impurity ions being obliquely incident to said second semiconductor region and said fourth impurity ions being approximately perpendicularly incident to said second semiconductor region.

5. A method as set forth in claim 4, wherein a concentration of said second impurity ions is larger than a concentration of said first impurity ions, and a concentration of said fourth impurity ions is larger than a concentration of said third impurity ions.

6. A method as set forth in claim 4, wherein said first MIS transistor comprises a P channel type MIS transistor and said second MIS transistor comprises an N channel type MIS transistor.

7. A method for manufacturing a first MIS transistor of a first conductivity type and a second MIS transistor of a second conductivity type opposite to said first conductivity type by using a semiconductor substrate, comprising the steps of:

forming a first semiconductor region of said second conductivity type for said first MIS transistor on said semiconductor substrate;

forming a second semiconductor region of said first conductivity type for said second MIS transistor on said semiconductor substrate;

forming first and second gate insulating layers on said first and second semiconductor regions, respectively;

forming first and second gate electrodes on said first and second gate insulating layers, respectively;

introducing first impurity ions of said first conductivity type into said first semiconductor region with a mask of said first gate electrode and a first mask covering said second semiconductor region, said first impurity ions being approximately perpendicularly incident to said first semiconductor region;

forming first and second sidewall insulating layers on sidewalls of said first and second gate electrodes, respectively;

introducing second and third impurity ions of said second conductivity type into said second semiconductor region with a mask of said second gate electrode and said second sidewall insulating layer and a second mask covering said first semiconductor region, said second impurity ions being obliquely incident to said second semiconductor region and said third impurity ions being approximately perpendicularly incident to said second semiconductor region.

8. A method as set forth in claim 7, wherein a concentration of said third impurity ions is larger than a concentration of said second impurity ions.

9. A method as set forth in claim 7, wherein said first MIS transistor comprises a P channel type MIS transistor and said second MIS transistor comprises a N channel type MIS transistor.

* * * * *